United States Patent
Edman et al.

(10) Patent No.: US 6,653,433 B2
(45) Date of Patent: Nov. 25, 2003

(54) POLYIMIDE COMPOSITION HAVING IMPROVED PEEL STRENGTH WHEN CLAD

(75) Inventors: James Richard Edman, Circleville, OH (US); Meredith Lynn White, Can Winchester, OH (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 196 days.

(21) Appl. No.: 09/848,895

(22) Filed: May 4, 2001

(65) Prior Publication Data

US 2002/0010311 A1 Jan. 24, 2002

Related U.S. Application Data

(62) Division of application No. 09/449,066, filed on Nov. 24, 1999, now abandoned.

(51) Int. Cl.[7] .................. C08G 73/10; C08G 69/28; C08L 79/08; C08L 77/00; B32B 27/00
(52) U.S. Cl. ............... 528/170; 528/125; 528/126; 528/128; 528/171; 528/172; 528/173; 528/174; 528/176; 528/183; 528/185; 528/188; 528/220; 528/229; 528/350; 528/351; 528/353; 428/411.1; 428/457; 428/458; 525/420; 525/432; 525/436; 524/600; 524/602
(58) Field of Search ................ 428/411.1, 475.5, 428/457, 458; 528/125, 126, 128, 170, 172, 173, 174, 183, 185, 188, 220, 229, 350, 353, 176; 525/420, 432, 436; 524/600, 602

(56) References Cited

U.S. PATENT DOCUMENTS 3,179,614 A * 4/1965 Edwards ............ 524/726
3,179,630 A * 4/1965 Endrey ............ 525/436
3,179,634 A * 4/1965 Edwards ............ 428/379
4,166,170 A    8/1979 St. Clair
4,931,540 A * 6/1990 Mueller et al. ............ 528/353
5,091,505 A    2/1992 Serafini et al.
5,096,998 A    3/1992 Manos
5,132,395 A    7/1992 Serafini et al.
5,145,943 A * 9/1992 Li et al. ............ 528/353
5,149,760 A    9/1992 Serafini et al.
5,149,772 A    9/1992 Serafini et al.
5,152,863 A    10/1992 Manos
5,272,194 A    12/1993 Arduengo, III et al.
5,324,475 A * 6/1994 Okahashi et al. ............ 264/555
5,338,827 A    8/1994 Serafini et al.
5,432,001 A    7/1995 Serafini et al.
5,460,890 A * 10/1995 Okahashi et al. ............ 428/458
5,461,138 A    10/1995 Serafini et al.
5,543,222 A * 8/1996 Edman et al. ............ 428/335
5,667,851 A * 9/1997 Edman et al. ............ 205/95

* cited by examiner

Primary Examiner—P. Hampton-Hightower

(57) ABSTRACT

A polyimide film that exhibits improved peel strength when clad with a metal layer is prepared by reacting a polyamic acid polymer and an esterified polyamic acid oligomer. The esterified oligomer has from two to twenty repeating units and at least two crosslinkable groups selected from the group consisting of carbonyl, cyano, hydroxy, alkyne, maleimide, norbornene and sulfonyl groups. The polyamic acid is dissolved in a solvent to form a polyamic acid solution, which has a minimum gel-film forming temperature, or a minimum green film forming temperature, associated therewith. The esterified polyamic acid oligomer has an imidization temperature, which is higher than the minimum gel-film forming temperature, or the minimum green film forming temperature, of the polyamic acid solution.

17 Claims, No Drawings

POLYIMIDE COMPOSITION HAVING IMPROVED PEEL STRENGTH WHEN CLAD

FIELD OF THE INVENTION

The present invention relates generally to polyimide compositions and more particularly to metal clad laminates made therefrom wherein the laminates have improved peel strength.

BACKGROUND OF THE INVENTION

Polyimides constitute a class of valuable polymers characterized by high thermal stability, inert character, insolubility in strong solvents, and high glass transition temperatures, among other properties. Polyimide precursors are polyamic acids, which are then imidized by either chemical or thermal processing to form a polyimide.

Polyimide films are found in a wide variety of applications in the flexible circuit industry. These films are used primarily as the base dielectric material in the construction of the flexible circuit. In the manufacture of circuit laminates, the polyimide films are generally clad with a metal layer, usually copper. As used herein the term "metal layer" means a layer made from a single metal such as copper, tin, chromium, nickel, silver or gold or a metal alloy. The metal layer may be in the form of a prefabricated metal foil, which is subsequently bonded to the surface of the polyimide film substrate. Bonding is accomplished by well-known means, such as the use of numerous types of adhesives. It is also known to cast an imidizable polyamic acid solution directly onto a metal foil, thereafter imidize the polyamic acid, and drive off the solvents which ultimately accomplishes the bonding.

Another method of bonding a metal layer to a polyimide film involves sputtering or vapor depositing metal onto the surface of the film. This step is typically followed by an electroplating or electroless-plating step, which increases the metal layer to the desired thickness. Those skilled in the art will appreciate that sputtering and plating in general may be used to deposit and bond, a plurality of different metallic foils to the surface of the polyimide substrate. For example, it is known to first sputter a chromium layer, followed by a copper layer, followed by copper electroplating to produce a copper foil laminated polyimide film. Thus, the term "metal layer" as used herein includes a single layer of a single metal, or may include an alloy, and may include multiple layers of differing metals and alloys.

Circuitry is fabricated by known etching techniques applied to the polyimide/metal laminate.

It is believed that a common location for failure in the circuit laminates is in the outer surface of the polyimide film. It is theorized that a weak boundary layer may exist at the surface of the polyimide, which ultimately becomes the 'weak link' in the laminate construction. It is believed that the failures may occur at a depth of approximately 10 nm into the polyimide film.

It has been known in the art of polyimide film processing to use tin additives in the polyimide composition to improve the peel strength of metal layer clad polyimide films. However, these additives have been found to cause a color change in the film, which is undesirable in the circuitry industry. Thus, a need exists for a technique that improves the peel strength of the metal clad polyimide film laminate without changing the color of the polyimide film.

SUMMARY OF THE INVENTION

In accordance with the present invention there is provided a polyimide composition which, when made in film form and clad with a metal layer, exhibits improved peel strength between the film and metal layer. The polyimide composition of the invention comprises the reaction product of components comprising:

(a) a polyamic acid, said polyamic acid being dissolved in a solvent so as to form a solution;
said polyamic acid having a minimum gel-film formation temperature and a minimum green film formation temperature associated therewith;

(b) an esterified polyamic acid oligomer having from two to twenty repeating units;
said oligomer having at least two crosslinkable groups selected from the group consisting of carbonyl, cyano, hydroxy, alkyne, maleimide, norbornene and sulfonyl groups;
said oligomer having an imidization temperature associated therewith; and
said imidization temperature of said oligomer being greater than the minimum gel-film formation temperature or the minimum green film formation temperature; and
said esterified polyamic acid oligomer being soluble in said polyamic acid solution and present in an amount of 0.5 to 10 weight percent of the combined weights of components (a) and (b).

The peel strength of laminates made by cladding the polyimide film of the present invention with a copper metal layer have been determined using the IPC Peel Strength, Flexible Printed Wiring Materials method 2.4.9, Revision C, Method B when an acrylic adhesive is used. Peel strength of a laminate, when sputtering and electroplating methods are used in the fabrication, is measured by Method 2.4.9A of IPC-TM-650. Both test results are reported in pounds per linear inch, pli (N/cm). The test results reported herein reveal that the laminates, made using either an adhesive or sputtering and electroplating, exhibit peel strengths of at least 8 pli (14 N/cm). Peel strengths as high as 12–14 pli (21–24 N/cm) have been observed. The present invention also has the desired feature that no color change in the polyimide composition, such as the color change associated with tin additives, is observed in the polyimide film.

DETAILED DESCRIPTION OF THE INVENTION

The polyimide composition of the invention comprises the reaction product of a polyamic acid (a) and an esterified polyamic acid oligomer (b).

As is known in the art, the polyamic acid (a) is a reaction product of one or more dianhydride monomers and one or more diamine monomers. The polyamic acid (a) is capable of imidization, either by chemical or thermal conversion, thereby forming a polyimide.

In accordance with the present invention, the polyamic acid is dissolved in a solvent so as to form a polyamic acid solution.

When operating a chemical conversion process, the polyamic acid solution (a) has a "minimum gel-film formation temperature" associated therewith. As used herein the term "minimum gel-film formation temperature" means that temperature at which imidization of the polyamic acid occurs, in a chemical conversion process, to such an extent that a self-supporting gel-film is formed within twenty minutes. The minimum gel-film formation temperature may be as low as 15° C. It is understood by those skilled in the art however, that gel-film formation temperatures well in excess of the minimum are preferably employed so that a self-supporting gel-film is formed in a much shorter time. In a continuous film casting operation for example, the formation of the self-supporting gel-film preferably occurs in less than two minutes. This corresponds to gel-film formation temperatures between about 60° and 125° C. During the gel-film formation step, solids content of the gel film is typically about 20 weight percent.

When utilizing a thermal conversion process, the polyamic acid solution (a) has a "minimum green film formation temperature" associated therewith. As used herein the term "minimum green film formation temperature" means that temperature at which solvent loss and imidization of the polyamic acid occurs, in a thermal conversion process, to such an extent that a self-supporting green film is formed in sixty minutes or less. The minimum green film formation temperature may be as low as 50° C. Higher green film formation temperatures are employed to form self-supporting films in shorter times. As a practical matter however, green film formation temperatures in excess of 200° C. are not generally used because poor film quality results. The green film has a solids content that is typically about 75 weight percent and the level of imidization is generally only 25 to 30% of full imidization.

The esterified polyamic acid oligomer (b) is soluble in the polyamic acid solution (a) and has an imidization temperature associated therewith. As used herein in connection with the esterified polyamic acid oligomer (b) the term "imidization temperature" means that temperature at which substantial imidization occurs at the ester sites, yielding an alcohol byproduct. Preferably, the imidization temperature of the esterified polyamic acid oligomer (b) is at least 140° C., regardless whether chemical or thermal conversion is employed. This is in stark contrast to simple polyamic acids where imidization can occur even at room temperature with chemical conversion. Thus, the minimum gel-film and/or green film formation temperature the polyamic acid solution (a) and the actual gel-film and/or green film formation temperature employed, is less than the imidization temperature of the esterified polyamic acid oligomer (b).

The esterified polyamic acid oligomer (b) has a least two crosslinkable groups selected from the group consisting of carbonyl, cyano, hydroxy, alkyne, maleimide, norbornene, and sulfonyl groups. While not intending to be bound by any particular theory, it is believed that during the drying and imidization steps in polyimide film manufacture, the oligomer (b) may diffuse toward the surface of the film and impart that portion of the film with greater strength as a result of forming cross-linked bonds.

The esterified polyamic acid oligomer (b) can have from 2 to 20 repeating units, and preferably from 2 to 7 repeating units. Less than two repeating units does not comprise an oligomer. At more than about twenty repeating units, the oligomer begins to take on the characteristics of a polymer. An esterified polyamic acid oligomer of no greater than 20 units ensures that it can readily diffuse to the surface of the polyamic acid (a), in either a gel-film or green film state, prior to full imidization of the sheet.

In order to effectively impart improved peel resistance to laminates made by cladding the polyimide of the invention with a metal layer, the esterified polyamic acid oligomer is present in an amount of 0.5 to 10 weight percent and preferably in an amount of 1.0 to 3.0 weight percent based upon the combined dry weights of the polyamic acid and esterified polyamic acid oligomer.

Polyamic Acid Solution

The polyamic acid solution (a) comprises a polyamic acid prepared from a tetracarboxylic acid or dianhydride component, and a diamine component. This is done in the presence of a polar, aprotic solvent. Preferably, the polyamic acid has a minimum gel-film formation temperature or a minimum green film formation temperature below 140° C.

Polyamic Acid Monomer Selection

The polyamic acid used in the present invention is prepared by copolymerizing substantially equimolar amounts of an organic tetracarboxylic acid (or its dianhydride) and a diamine. Aromatic tetracarboxylic acids and diamines may be employed. The aromatic tetracarboxylic acid component may include biphenyltetracarboxylic acid or its functional derivative, pyromellitic acid, or other functional derivatives, or combinations of both. Some suitable examples of the aromatic tetracarboxylic acid component include pyromellitic acid and its dianhydride; 3,4,9,10-perylene tetracarboxylic dianhydride; naphthalene-2,3,6,7-tetracarboxylic dianhydride; naphthalene-1,4,5,8-tetracarboxylic dianhydride; 4,4'-oxydiphthalic dianhydride; 3,3',4,4'-biphenylsulfone tetracarboxylic dianhydride; 2,3,2',3'-benzophenonetetracarboxylic dianhydride; 3,3',4,4'-benzophenone tetracarboxylic dianhydride; bis(3,4-dicarboxyphenyl)sulfide dianhydride; bis(3,4-dicarboxyphenyl)methane dianhydride; 2,2-bis(3,4-dicarboxyphenyl)propane dianhydride; 2,2-bis(3,4-dicarboxyphenyl)hexafluoropropane; 2,2',3,3'-biphenyltetracarboxylic dianhydride; 3,3',4,4'-biphenyltetracarboxylic dianhydride; 2,6-dichloronaphthalene-1,4,5,8-tetracarboxylic dianhydride; 2,7-dichloronaphthalene-1,4,5,8-tetracarboxylic dianhydride; 2,3,6,7-tetrachloronaphthalene-1,4,5,8-tetracarboxylic dianhydride; phenanthrene-,8,9,10-tetracarboxylic dianhydride; pyrazine-2,3,5,6-tetracarboxylic dianhydride; benzene-1,2,3,4-tetracarboxylic dianhydride; and thiophene-2,3,4,5-tetracarboxylic dianhydride.

Some suitable organic diamines include meta-phenylenediamine; para-phenylenediamine; 1,2-diaminobenzene; 4,4'-diaminodiphenylmethane; 2,2-bis(4-aminophenyl)propane; 4,4'diaminodiphenyl propane; 4,4'-diaminodiphenyl sulfide; 4,4'-diaminodiphenyl sulfone; 3,3'-diaminodiphenyl sulfone; 3,4'diaminodiphenyl ether; 4,4'-diaminodiphenyl ether; 2,6-diaminopyridine; bis(3-aminophenyl)diethyl silane; 4,4'diaminodiphenyl diethyl silane; benzidine; 3,3'-dichlorobenzidine; 3,3'-dimethoxybenzidine; 4,4'-diaminobenzophenone; N,N-bis(4-aminophenyl)-n-butylamine; N,N-bis(4-aminophenyl)methylamine; 1,5-diaminonaphthalene; 3,3'-dimethyl-4,4'-diaminobiphenyl; 4-aminophenyl-3-aminobenzoate; N,N-bis(4-aminophenyl)aniline; 2,4-bis(beta-amino-t-butyl)toluene; bis(p-beta-amino-t-butylphenyl)ether; p-bis-2-(2-methyl-4-aminopentyl)benzene; p-bis(1,1-dimethyl-5-aminopentyl)benzene; 1,3-bis(4-aminophenoxy)benzene; m-xylylenediamine; p-xylylenediamine; 4,4'-diaminodiphenyl ether phosphine oxide; 4,4'-diaminodiphenyl N-methyl amine; and 4,4'-diaminodiphenyl N-phenyl amine.

The preparation of polyimides and polyamic acids is more fully described in U.S. Pat. Nos. 3,179,614; 3,179,630; and 3,179,634 the disclosures of which are incorporated herein by reference.

The most preferred polyamic acid for the present invention is prepared from dianydride monomers comprising pyromellittic dianhydride, alone or in combination with up to 70 mole % biphenyldianhydride, and preferably 20–70 mole % biphenyldianhydride. Preferred diamines comprise oxidianiline, used alone or in combination with, up to 90 mole % para-phenylene diamine, and preferably 10–90 mole % para-phenylene diamine. Copolymerization of the dianhydride and diamine monomers is carried out in an inert solvent at temperatures not higher than 140° C., preferably not higher than 90° C. for about one minute to several days. The components can be added either neat, as a mixture, or as solutions to the organic solvent, or the organic solvent may be added to the components.

It is not required that the tetracarboxylic acid (or its dianhydride) and the diamine components be used in absolutely equimolar amounts. In order to adjust the molecular weight, the molar ratio of tetracarboxylic acid to diamine component can range from 0.90 to 1.10.

The polyamic acid solution prepared as described above may contain polyamic acid polymer in an amount from approximately 5% to 40% and preferably 10% to 25% by weight in the solvent.

Organic Solvent

The organic solvent should dissolve the monomeric components and the polyamic acid formed therefrom. The solvent must be substantially unreactive with all of the monomeric components and with the polyamic acid. Preferred solvents include normally liquid N,N-dialkylcarboxylamides such as N,N-diethyl-formamide and N,N-diethylacetamide. Other solvents that may be used are dimethylsulfoxide, N-methylpyrrolidone, N-cyclohexyl-2-pyrrolidone, tetramethyl urea, dimethylsulfone, hexamethylphosphoramide, tetramethylenesulfone, diglyme, pyridine and the like. The solvents can be used alone or in combination with themselves or in combination with poor solvents such as benzene, benzonitrile and dioxane.

Esterified Polyamic Acid Oligomer

The esterified polyamic acid oligomer (b) is soluble in the polyamic acid solution (a) and has an imidization temperature which is greater than the minimum green film or minimum gel-film formation temperature of the polyamic acid polymer. The oligomer includes at least two crosslinkable groups (groups that are typically used specifically in the thermosetting polyimide industry) selected from the group consisting of carbonyl, cyano, hydroxy, alkyne, maleimide, norbornene, and sulfonyl groups. The crosslinkable groups may have their origin in the dianhydride or diamine components or in an endcapping agent, as is explained below.

Suitable dianhydrides for the preparation of the esterified polyamic acid oligomer (b) include pyromellitic dianhydride, 2,2',3,3'-biphenyltetracarboxylic dianhydride; 3,3',4,4'-biphenyl tetracarboxylic dianhydride; 4,4'-oxydiphthalic anhydride; 2,3,2',3'-benzophenonetetracarboxylic dianhydride; 3,3',4,4'-diphenylsulfone tetracarboxylic dianhydride; bis(3,4-dicarboxyphenyl)methane dianhydride; 2,2-bis(3,4-dicarboxyphenyl)propane dianhydride; and the most preferred being 3,3'4,4'-benzophenone tetracarboxylic dianhydride.

Suitable diamines for the preparation of the esterified polyamic acid oligomer (b) include m-phenylene diamine; para-phenylene diamine; diaminobenzophenone, and 4,4'-oxydianline; 3,4'-oxydianiline; 4,4'-diaminodiphenylmethane; 2,2-bis(4-aminophenyl)propane; 4,4'diaminodiphenyl propane; 4,4'-diaminodiphenyl sulfone; 3,3'-diaminodiphenyl sulfone; bis(3-aminophenyl) diethyl silane; 4,4'diaminodiphenyl diethyl silane; benzidine; 1,3-bis(4-aminophenoxy)benzene; p-diaminodiphenyl acetylene; 3,3'-dihydroxy-4,4'-diamino-biphenyl; 3,3'-diamino-4,4'-dihydroxy-biphenyl; 1,3-bis(3-aminophenoxy)-5-cyano-benzene; the most preferred being m-phenylene diamine.

The molecular weight of the esterified polyamic acid oligomer (b) can be controlled in two ways. In the first way, alcohols or amine compounds may be added to the dianhydride to form a monoanhydride. For example, in the case of an alcohol being added to the dianhydride, the monoanhydride formed will have an acid group and an ester group, or may have two ester groups. Generally, the amount of alcohol or amine compound required is about 10–70 mole %, preferably 50 mole %, based on the total number of anhydride groups. Ultimately, it is the formation of an ester group on the anhydride that will later prevent polymerization with a diamine. However, this method is not preferred because final chain length of the oligomer is difficult to control.

The preferable method of oligomer chain length control is to add an endcapping compound such as nadic anhydride, maleic anhydride, phenyl ethynyl phthalic anhydride, and most preferably phthalic anhydride, to the diamine of the oligomer. The amount of endcapping compound should be 10–70 mole %, preferably 50 mole %, based on the total number of amine groups. By endcapping the diamine prior to reaction with the dianhydride, final oligomer chain length is controlled. After the use of either method described above, substantially all the anhydride and amine species are reacted together to form a polyamic acid oligomer.

To enable esterification of the polyamic acid oligomer a catalyst, like trifluoroacetic anhydride, is added to "ring close" the polyamic acid oligomer precursor to form an oligo (iso-imide). After forming the oligo (iso-imide), a stoichiometric excess of an alcohol with respect to the number of iso-imide groups, is added to the oligo (iso-imide) to obtain the esterified polyamic acid oligomer (b) of the present invention.

Ethanol is the preferred alcohol used for esterification of the polyamic acid oligomer precursor. However, it is believed that any aliphatic alcohol, which has less than about ten carbon atoms, can be used. One practicing this invention should note that when an excess amount of alcohol is added, which should theoretically provide for full esterification, a considerable number of amic acid groups remain present. The present inventors have found that in order to obtain the improved peel strengths attributable to the present invention, a minimum of at least 10% of the iso-imide groups should be esterified. Esterification from 30% to 40% is preferred.

Preferably, the esterified polyamic acid oligomer (b) is represented by the following formula:

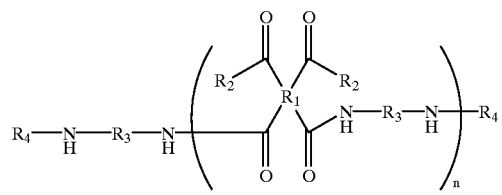

wherein n is equal to 2 to 20;

wherein each $R_1$ is independently selected from the group consisting of:

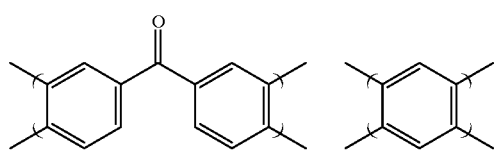

-continued

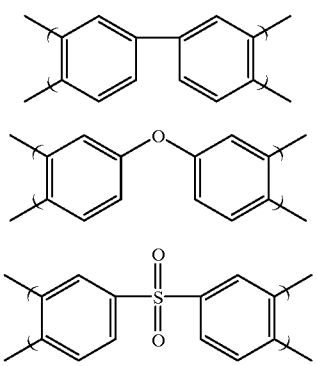

wherein each $R_2$ is independently selected from the group consisting of:

—(OH,   —(O—CH$_3$,   —(O—C$_2$H$_5$,

—(O—C$_3$H$_7$,   —(O—C$_4$H$_9$,   —(O—C$_5$H$_{11}$,

—(O—C$_6$H$_{13}$,   —(O—C$_7$H$_{15}$ with the proviso that no more than 90% of said $R_2$ groups are —OH groups;

wherein each $R_3$ is independently selected from the group consisting of:

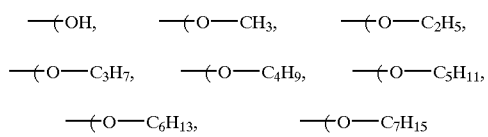

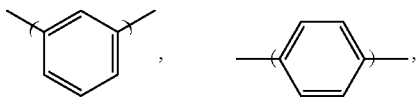

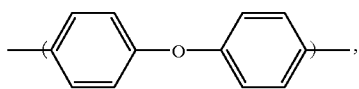

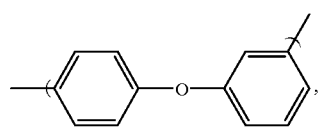

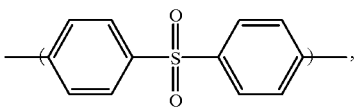

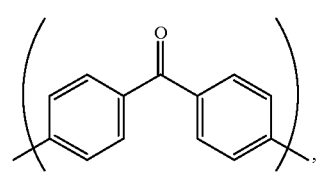

-continued

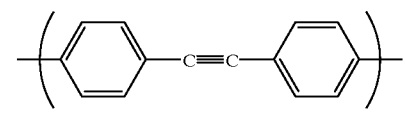

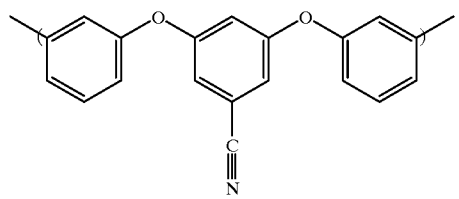

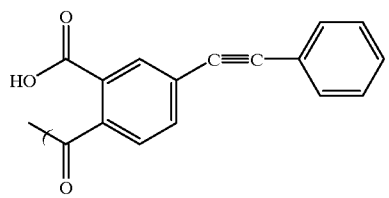

wherein each $R_4$ is independently selected from the group consisting of:

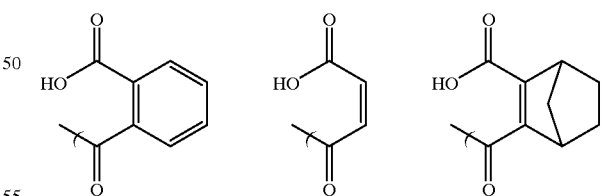

with the proviso that the oligomer has at least two crosslinkable groups selected from the group consisting of carbonyl, cyano, hydroxy, alkyne, maleimide, norbornene and sulfonyl groups.

Most preferably, the esterified polyamic acid oligomer (b) is represented by the following formula:

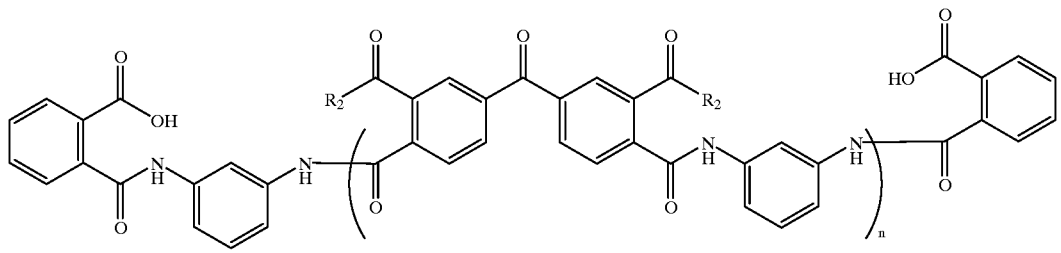

wherein n is 2 to 7, each $R_2$ is independently selected from the group consisting of ethoxy and hydroxy groups, with the proviso that no more than 90% of said $R_2$ groups are hydroxy groups.

In accordance with the present invention, the amount of the esterified polyamic acid oligomer (b) may vary from approximately 0.5 to 10% by weight based on the combined dry weights of the polyamic acid and esterified polyamic acid oligomer. Preferably, the amount of esterified polyamic acid oligomer (b) is from 1.0 to 3.0% by weight based on the combined dry weights of the polyamic acid and esterified polyamic acid oligomer.

Process of Manufacturing the Film

The polyamic acid (a) and the esterified polyamic acid oligomer (b) may be converted using either a chemical or thermal conversion film process.

Chemical Conversion

In the chemical conversion process, the polyamic acid solution (a) (including the esterified polyamic acid oligomer (b)) is either immersed in, or mixed with conversion chemicals. Polyamic acid conversion chemicals are typically anhydride dehydrating materials and tertiary amine catalysts. The preferred anhydride dehydrating material is acetic anhydride and is often used in molar excess of the amount of amide acid groups in the polyamic acid. Typically about 2 to 2.4 moles of anhydride dehydrating material per repeating unit of polyamic acid is used. A comparable amount of tertiary amine catalyst is often used.

Other operable lower fatty acid anhydrides, which may be used in place of acetic anhydride, include propionic anhydride, butyric anhydride, valeric anhydride and mixtures thereof. These anhydride mixtures can also be combined with mixtures of aromatic monocarboxylic acids for example, benzoic acid or naphthoic acid, or with mixtures of anhydrides of carbonic and formic acids, as well as aliphatic ketenes (ketene and dimethyl ketene). Ketenes may be regarded as anhydrides of carboxylic acids derived from drastic dehydration of the acids.

The preferred tertiary amine catalysts are pyridine and beta picoline. They are used in varying amounts up to several moles per mole of anhydride dehydrating material. Other tertiary amines having approximately the same activity as the preferred pyridine and beta-picoline and may also be used. These include alpha-picoline; 3,4-lutidine; 3,5-lutidine; 4-methyl pyridine; 4-isopropyl pyridine; N,N-dimethylbenzyl amine; isoquinoline; 4-benzyl pyridine, N,N-dimethyldodecyl amine and triethyl amine.

In the chemical conversion process, the polyamic acid solution (a) (including the esterified polyamic acid oligomer (b) and conversion chemicals) is cast on a surface such as a metal drum or belt and heated to a temperature at or above the minimum gel-film formation temperature of the polyamic acid (a), but below the imidization temperature of the esterified polyamic acid oligomer (b). The self-supporting gel-film is stripped off the surface and transported to a tenter oven to complete imidization under high temperature processing. In the tenter oven, the film is heated to temperatures in excess of the imidization temperature of the esterified polyamic acid oligomer (b). Thus, the film is dried of remaining solvents, becomes fully imidized and the crosslinking of the oligomer to the rest of the polyimide film is complete.

Another method of chemically converting the polyamic acid solution (a) (including the esterified polyamic acid oligomer (b)) is to extrude the acid solution into a bath of conversion chemicals. The bath contains anhydride and tertiary amine components, and may or may not contain a diluting solvent. The extruded acid solution is then subjected to a temperature at or above the minimum gel-film formation temperature, but not to a temperature that is greater than the imidization temperature of the esterifed polyamic acid oligomer (b). Again, a self-supporting gel-film is formed.

Next, the gel-film is heated in a tenter oven to a temperature in excess of the imidization temperature of the esterified polyamic acid oligomer (b). The volatiles are removed, full imidization is achieved, and oligomer crosslinking is complete. Because the gel-film in chemical conversion process has a high liquid content, it must be restrained during the heating step to avoid undesirable shrinkage.

During continuous production of a film, the film is clipped or pinned at the edges for restraint. As part of the manufacturing process, the film can be stretched in either the machine direction, or the transverse direction, during final heating. Final film temperatures between 400° C. and 500° C. are required to achieve optimum film properties.

Thermal Conversion

In a thermal conversion process the polyamic acid solution (a) (including the esterified polyamic acid oligomer (b)) is cast onto a surface and heated to a temperature at or above the minimum green film formation temperature. The highest casting temperature employed should be lower than the imidization temperature of the esterified polyamic acid oligomer (b).

The self-supporting green film is stripped from the casting surface and transported to a tenter oven for high temperature processing and full imidization. In the tenter oven, the film is heated to temperatures in excess of the imidization temperature of the esterified polyamic acid oligomer (b), so that the film is dried of remaining solvents, is fully imidized, and oligomer crosslinking is complete.

The advantageous properties of the present invention can be observed by referencing the following examples, which illustrate but do not limit, this invention. All parts and percentages are by weight unless otherwise indicated. In the discussion above and in the examples RH means relative humidity.

EXAMPLES

Method for Determining Increased Peel Strength

Increase in peel strength was determined using the IPC Peel Strength, Flexible Printed Wiring Materials Method 2.4.9, Revision C, Method B with an acrylic adhesive having the following composition:

| INGREDIENT | AMOUNT (WEIGHT %) |
|---|---|
| A terpolymer which is the reaction product of 35 weight % acrylonitrile, 60 weight % of butyl acrylate and 5 weight % of methacrylic acid | 95 |
| Phenol formaldehyde resin | 5 |

Method B calls for a clad flexible material to be the specimen type. The 5 layer clad flexible material comprising, 1 oz. (28.375 g) RA copper, acrylic adhesive, polyimide film, acrylic adhesive, RA copper, was prepared by laminating the layers together at a pressure of 350 psi (2412 kPa) and temperature of 350° F. (180° C.). The optimum heating rate was 10–15° F./min (5–8° C./min).

IPC test number 2.4.9, Revision C, Method B was performed on the 5-layer laminate. The clad specimen was cut into strips ½ inch (1.27 cm) wide, and 9 inches (22.86 cm) long, by a Thwing-Albert sample cutter. At least four specimens were prepared for testing. The specimens were conditioned at 23° C., 50% RH for 24 hours prior to being subjected to the peel test.

The specimen was then attached to a 6 inch (15.24 cm) in diameter German wheel test fixture with double-sided tape. Using a cross head speed of 2 inches/min. (5.08 cm/min.), the copper foil was peeled up and away. The peel load was continuously recorded for a minimum of 2.25 inches (5.72 cm). The data is presented here as peel strength, in pounds per linear inch, pli (N/cm), corresponding to the both air side and the drum side of the polyimide. This was measured from the average load per width of a ½ inch (1.27 cm) specimen.

Example 1

Preparation of the Polyamic Acid Solution 21.812 kg (0.1 kmol) of purified powdery pyromellitic dianhydride was added, in small portions while agitating at 20° C., to a solution of 20.024 kg (0.1 kmol) of 4,4'-diaminodiphenyl ether in 190.6 kg of dry N,N-dimethylacetamide. The solution was stirred continuously for one hour, after the final addition, to give a clear polyamic acid solution having a viscosity of 3500 poise at 20° C.

Preparation of the Esterified Polyamic Acid Oligomer

An esterified polyamic acid oligomer was prepared by adding 0.03 mole benzophenone tetracarboxylic dianhydride (BTDA) to dimethyl acetamide (DMAC) solvent at about 100° C. The mixture was stirred until the BTDA was visibly dissolved and cooled to about 60° C. Subsequent addition of 0.015 mole of ethyl alcohol was carried out to end-cap 0.015 moles of BTDA by formation of an acid-ester. The mixture was stirred and cooled for 1 hour to ensure reactions were complete. A polyamic acid oligomer was formed upon the addition of 0.0225 moles of metaphenylene diamine dissolved in DMAC. Again the mixture was stirred and held for at least 2 hours to ensure reaction completion. Adding 0.045 moles neat, trifluoroacetic anhydride to the polyamic acid oligomer formed an oligo (iso-imide). The addition of the trifluoracetic anhydride was made dropwise to the solution, while stirring, to prevent uncontrolled coagulation of transient precipitate. The reaction mixture was again held for 2 hours to ensure completion. Finally, a ring opening addition was carried out on the iso-imide by the addition of 0.09 moles of ethanol and moderate heating at 50° C. with stirring. Once cooled to room temperature, pouring the reaction mixture into deionized water and acetone precipitated the resultant esterified polyamic acid oligomer. Filtration and drying was performed to isolate the esterified polyamic acid oligomer. This esterified polyamic acid oligomer had 4 to 5 repeating units and an imidization temperature of 150° C. The level of esterification as measured by NMR testing was between 30 and 40%.

Process of Film Casting

The esterified polyamic acid oligomer dissolved in DMAC was then added to the polyamic acid solution in varying concentrations. Thereafter, appropriate amounts of conversion chemicals in the form of acetic anhydride and beta-picoline were added.

After rigorous mixing, the combined polyamic acid solution (including conversion chemicals and the esterified polyamic acid oligomer) were cast onto a surface heated to about 80° C. The gel-film thus formed was then subjected to a heating step wherein it was held at 150° C. for 30 minutes and thereafter subjected to 430° C. for 5 minutes to complete drying, imidization, and crosslinking.

Table 1 shows the peel strength of laminates made from the polyimide film clad with a metal layer in accordance with the above-described peel test, as performed on each side of the polyimide film, i.e. either in contact with the casting surface or the air side.

TABLE 1

| | Peel Strength in pli units (N/cm) | |
|---|---|---|
| % Oligomer | Air Side | Casting Surface |
| 0 | 6.0 (10.5) | 6.4 (11.2) |
| 0.33 | 6.5 (11.4) | 6.9 (12.1) |
| 0.66 | 8.5 (14.9) | 7.7 (13.5) |
| 0.99 | 9.1 (15.9) | 8.8 (15.4) |
| 1.32 | 14.2 (24.9) | 15.1 (26.4) |
| 1.64 | 14.0 (24.5) | 14.1 (24.7) |

Example 2

Polyamic solution (a) was prepared in accordance with EXAMPLE 1.

An esterified polyamic acid oligomer (b) was prepared by adding 0.75 mole meta-phenylene diamine to dimethyl acetamide solvent. The mixture was stirred until the diamine was visibly dissolved. A subsequent addition of 0.375 mole of phthalic anhydride was made. The mixture was stirred and held for ½ hour to ensure reactions were complete. A polyamic acid oligomer was formed upon the addition of 0.5625 moles benzophenone tetracarboxylic dianhydride. Again the mixture was stirred and held for 2 hours to ensure the reaction was complete. Adding 1.125 moles neat trifluoroacetic anhydride to the polyamic acid oligomer, while stirring, formed an intermediate oligo (iso-imide). The rate of addition was critical to prevent uncontrolled coagulation of transient precipitate and therefore kept below 0.54 moles/min. The reaction mixture was again held for 2 hours to ensure completion. Finally, a ring opening addition was carried out on the iso-imide by the addition of 2.25 moles of ethanol and moderate heating at 50° C. with stirring. Once cooled to room temperature, pouring the reaction mixture into deionized water precipitated the resultant esterified polyamic acid oligomer. Filtration and drying was performed to isolate the esterified polyamic acid oligomer. This esterified polyamic acid oligomer had between 4 and 5 repeating units and an imidization temperature of 150° C. The degree of esterification was measured to be 39.5% by NMR testing.

The oligomer was re-dissolved into DMAC to form a 10% by weight solution. The esterified polyamic acid oligomer and conversion chemicals were added to a polyamic acid solution in the same manner as described in Example 1, except that the oligomer loading level was held constant at 1.5% by weight of the combined weights of both the polyamic acid and esterified polyamic acid oligomer.

After rigorous mixing the polyamic acid solution, including the conversion chemicals and the esterified polyamic acid oligomer, was cast onto a surface and heated to about 80° C. to form a gel-film. The gel-film was then subjected to subsequent heating where the temperature was ramped from 80° C. to 430° C. over 10 minutes and thereafter allowed to cool.

Heats 1 and 2 represent two different temperature ramping profiles used during the above mentioned heating step.

TABLE 2

|  | Peel Strength in pli units (N/cm) | |
| --- | --- | --- |
|  | Casting Surface | Air Side |
| Control (no oligomer) | 9.2 (16.1) | 9.9 (17.3) |
| Heat 1 | 12.1 (21.2) | 12.6 (22.1) |
| Heat 2 | 13.4 (23.5) | 14.1 (24.7) |

Example 3

An esterified polyamic acid oligomer was prepared by adding 0.75 mole meta-phenylene diamine to dimethyl acetamide solvent. The mixture was stirred until the diamine was visibly dissolved. A subsequent addition of 0.375 mole of phthalic anhydride was made to end-cap the diamine. The mixture was stirred and held for 30 minutes to ensure reactions were complete. An polyamic acid oligomer was formed upon the addition of 0.5625 moles benzophenone tetracarboxylic dianhydride. Again the mixture was stirred and held for 2 hours to ensure a complete reaction. Adding 1.125 moles neat trifluoroacetic anhydride to the polyamic acid oligomer, while stirring, formed an intermediate oligo (iso-imide). The rate of addition was kept below 0.54 moles/min. to prevent uncontrolled coagulation of transient precipitate. The reaction mixture was again held for 2 hours to ensure completion. Finally, a ring opening addition was carried out on the oligo (iso-imide) by the addition of 2.25 moles of ethanol and moderate heating at 50° C. with stirring. Once cooled to room temperature pouring the reaction mixture into deionized water precipitated the resultant esterified polyamic acid oligomer. Filtration and drying were performed to isolate the esterified polyamic acid oligomer. This esterified polyamic acid oligomer had between 4 and 7 repeating units and had an imidization temperature of 150° C. The degree of esterification was measured to be 33.3% by NMR testing.

The oligomer was redissolved into DMAC to form a 10% by weight solution. The esterified polyamic acid oligomer and conversion chemicals were added to a polyamic acid solution in the same manner as described in Example 2.

After rigorous mixing the combined polyamic acid solution, the solution was cast onto a surface and heated to about 80° C. to form a gel-film. The gel-film was then subjected to a subsequent heating step wherein it was ramped from 80° C. to 430° C. over 10 minutes or less and thereafter allowed to cool.

Some polyimide film samples were made without esterified polyamic acid oligomer to be measured as a control.

The polyimide film samples made both with and without the addition of the esterified polyamic acid oligomer were metallized. Both film types were first dried at 250–350° C. under vacuum, subjected to a plasma discharge and then sputtered with a 65/35 Ni/Cu tie coat at $1 \times 10^{-3}$ to $5 \times 10^{-3}$ millibars (100 kPa to 500 kPa) pressure, to a thickness of 250–375 angstroms on both air and drum sides of the films. Subsequently, copper was sputter-coated onto the Ni/Cu tie coat to a thickness of 2500–3500 angstroms on both sides of the film. Finally, copper was electroplated onto the sputtered surfaces to a thickness of 36 microns ±10% using a solution of copper sulfate and sulfuric acid solution.

For the above-mentioned composites peel strength of the metallized polyimide film was determined by the IPC-TM-650 peel test method 2.4.9. The samples were prepared by masking and etching the copper to obtain ⅛ inch (3.175 mm) wide copper lines and spaces. The ⅛ inch (3.175 mm) strips of copper were then peeled from the polyimide film in accordance with Method A of IPC-TM-650 peel test method 2.4.9 using a German wheel as the test fixture. The following table shows that the addition of the esterified polyamic acid oligomer to a polyimide film formulation, improved peel strength by about 2 pli (3.5 N/cm) on both air and drum side.

TABLE 3

|  | Peel Strength in pli units (N/cm) | |
| --- | --- | --- |
|  | Casting Surface | Air Side |
| Control (no oligomer) | 8.6 (15.1) | 9.0 (15.8) |
| Sample (with oligomer) | 10.6 (18.6) | 10.7 (18.7) |

What is claimed is:

1. A polyimide composition comprising the reaction product of components comprising:
   (a) a polyamic acid said polyamic acid being dissolved in a solvent so as to form a solution;
      said polyamic acid having a minimum gel-film formation temperature and a minimum green film formation temperature associated therewith;
   (b) an esterified polyamic acid oligomer having from two to twenty repeating units;
      said oligomer having at least two crosslinkable groups selected from the group consisting of carbonyl, cyano, hydroxy, alkyne, maleimide, norbornene and sulfonyl groups;
      said oligomer having an imidization temperature associated therewith; and
      said imidization temperature of said oligomer being greater than at least one of the minimum gel-film formation temperature and minimum green film formation temperature; and
      said esterified polyamic acid oligomer being soluble in said polyamic acid solution and present in an amount of 0.5 to 10 weight percent of the combined weights of components (a) and (b).

2. A polyimide composition in accordance with claim 1 wherein said imidization temperature of said esterified polyamic acid oligomer (b) is 140° C. or greater.

3. A polyimide composition in accordance with claim 1 wherein said esterified polyamic acid oligomer has from two to seven repeating units.

4. A polyimide composition in accordance with claim 1 wherein said polyamic acid solution (a) is formed from the reaction product of:
   a tetracarboxylic acid dianhydride selected from the group consisting of
      pyromellitic dianhydride, 2,2',3,3'-biphenyltetracarboxylic dianhydride, 3,3',4,4'-biphenyltetracarboxylic dianhydride, 2,3,2',3'-benzophenonetetracarboxylic dianhydride, 3,3',4,4'-benzophenonetetracarboxylic dianhydride, naphthalene-2,3,6,7-tetracarboxylic dianhydride, naphthalene-1,4,5,8-tetracarboxylic dianhydride, 4,4'-oxydiphthalic dianhydride, 3,3',4,4'-biphenylsulfone tetracarboxylic dianhydride, 3,4,9,10-perylene tetracarboxylic dianhydride, bis(3,4-dicarboxyphenyl)sulfide dianhydride, bis(3,4-dicarboxyphenyl)methane dianhydride, 2,2-bis(3,4-dicarboxyphenyl)propane dianhydride, 2,2-bis(3,4-dicarboxyphenyl)hexafluoropropane, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-,8,9,10-tetracarboxylic dianhydride, pyrazine-2,3,5,6-tetracarboxylic dianhydride, benzene-1,2,3,4-tetracarboxylic dianhydride, and thiophene-2,3,4,5-tetracarboxylic dianhydride, and combinations thereof; and
   a diamine selected from the group consisting of meta-phenylenediamine, para-phenylenediamine, 1,2-diaminobenzene, 4,4'-diaminodiphenylmethane, 2,2-bis(4-aminophenyl)propane, 4,4'diaminodiphenyl propane, 4,4'-diaminodiphenyl sulfide, 4,4'-diaminodiphenyl sulfone, 3,3'-diaminodiphenyl sulfone, 3,4'diaminodiphenyl ether, 4,4'-diaminodiphenyl ether, 2,6-diaminopyridine, bis(3-aminophenyl)diethyl silane, 4,4'diaminodiphenyl diethyl silane, benzidine, 3,3'-dichlorobenzidine, 3,3'-dimethoxybenzidine, 4,4'-diaminobenzophenone, N,N-bis(4-aminophenyl)-n-butylamine, N,N-bis(4-aminophenyl)methylamine, 1,5-diaminonaphthalene, 3,3'-dimethyl-4,4'-diaminobiphenyl, 4-aminophenyl-3-aminobenzoate, N,N-bis(4-aminophenyl)aniline, bis(p-beta-amino-t-butylphenyl)ether, p-bis-2-(2-methyl-4-aminopentyl)benzene, p-bis(1,1-dimethyl-5-aminopentyl)benzene, 1,3-bis(4-aminophenoxy)benzene, m-xylylenediamine, p-xylylenediamine, 4,4'-diaminodiphenyl ether phosphine oxide, 4,4'-diaminodiphenyl N-methyl amine, 4,4'-diaminodiphenyl N-phenyl amine, and combinations thereof.

5. A polyimide composition in accordance with claim 1 wherein said polyamic acid solution (a) comprises a polar aprotic solvent.

6. A polyimide composition in accordance with claim 1 wherein said esterified polyamic acid oligomer (b) is formed from the reaction product of:
   a tetracarboxylic acid dianhydride selected from the group consisting of pyromellitic dianhydride, 2,2',3,3'-biphenyltetracarboxylic dianhydride, 3,3',4,4'-biphenyl tetracarboxylic dianhydride, 4,4'-oxydiphthalic anhydride, 2,3,2',3'-benzophenonetetracarboxylic dianhydride, 3,3'4,4'-benzophenone tetracarboxylic dianhydride, 3,3',4,4'-diphenylsulfone tetracarboxylic dianhydride, bis(3,4-dicarboxyphenyl)methane dianhydride, 2,2-bis(3,4-dicarboxyphenyl)propane dianhydride, and combinations thereof; and a diamine selected from the group consisting of m-phenylene diamine, para-phenylene diamine, diaminobenzophenone, and 4,4'-oxydianline, 3,4'-oxydianiline, 4,4'-diaminodiphenylmethane, 2,2-bis(4-aminophenyl)propane, 4,4'diaminodiphenyl propane, 4,4'-diaminodiphenyl sulfone, 3,3'-diaminodiphenyl sulfone, bis(3-aminophenyl)diethyl silane, 4,4'diaminodiphenyl diethyl silane, benzidine, 1,3-bis(4-aminophenoxy)benzene, p-diaminodiphenyl acetylene, 3,3,'-dihydroxy-4,4'-diamino-biphenyl, 3,3'-diamino-4,4'-dihydroxy-biphenyl, 1,3-bis(3-aminophenoxy)-5-cyano-benzene, and combinations thereof.

7. A polyimide composition in accordance with claim 1 wherein said esterified polyamic acid oligomer (b) has the general formula:

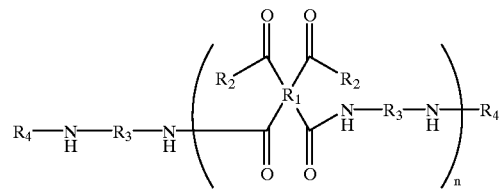

wherein n is equal to 2 to 20
   wherein each $R_1$ is independently selected from the group consisting of:

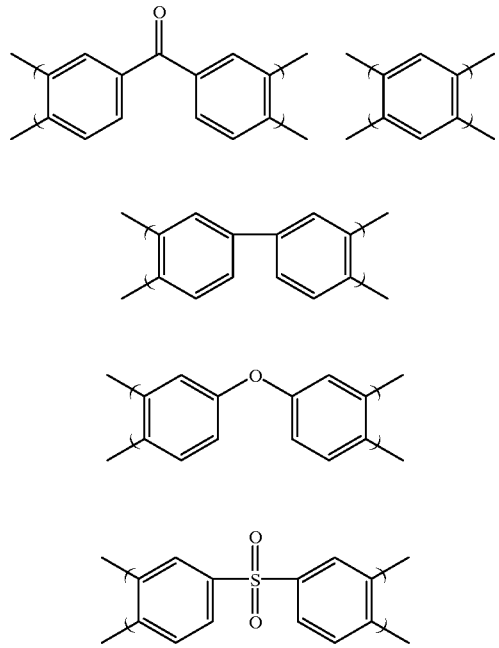

wherein each $R_2$ is independently selected from the group consisting of:

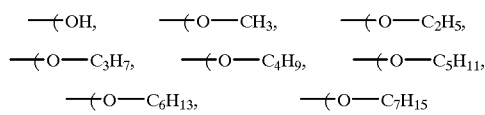

with the proviso that no more than 90% of said $R_2$ groups are —OH groups;

wherein each $R_3$ is independently selected from the group consisting of

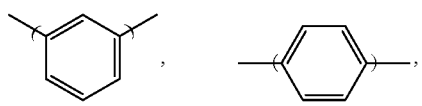

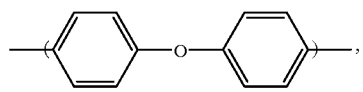

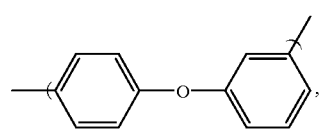

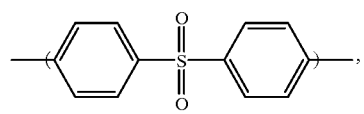

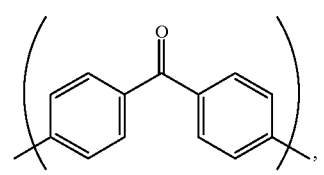

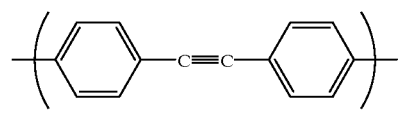

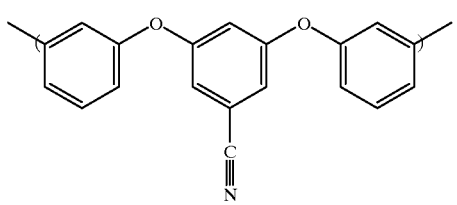

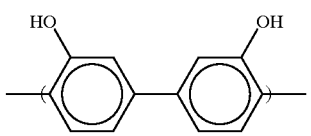

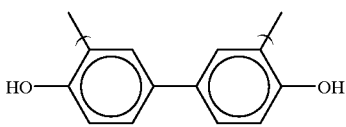

and wherein each $R_4$ is independently selected from the group consisting of

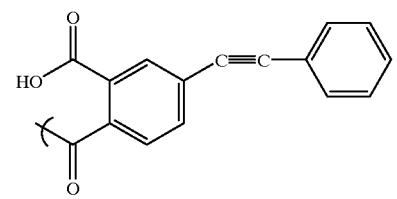

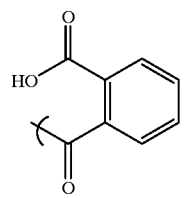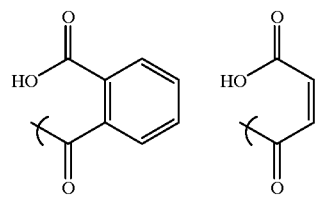

with the proviso that the oligomer has at least two crosslinkable groups selected from the group consisting of carbonyl, cyano, hydroxy, alkyne, maleimide, norbornene and sulfonyl groups.

8. A composition in accordance with claim 7 wherein said esterified polyamic acid oligomer has the formula:

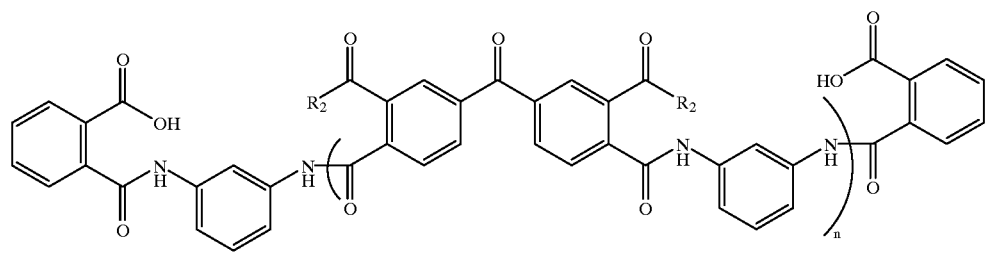

wherein n is 2 to 7, each $R_2$ is a group independently selected from the group consisting of ethoxy and hydroxy groups, with the proviso that no more than 90% of said $R_2$ groups are hydroxy groups.

9. A polyimide composition in accordance with claim 8 wherein said reaction product is obtained by chemical conversion employing a gel-film formation temperature between about 15 and 125° C.

10. A polyimide composition in accordance with claim 9 wherein said gel-film formation temperature is at least 60° C.

11. A polyimide composition in accordance with claim 1 wherein said esterified polyamic acid oligomer (b) is present in an amount of 1.0 to 3 weight percent of the combined weights of components (a) and (b).

12. An article of manufacture comprising a film made from the polyimide composition of claim 1.

13. An article of manufacture comprising:
a polyimide film substrate, said substrate presenting at least one surface;
said polyimide film substrate having the polyimide composition of claim 1; and
a metal layer bonded to said at least one surface.

14. An article of manufacture in accordance with claim 13 wherein said metal layer is bonded to said polyimide film substrate by an adhesive.

15. An article of manufacture in accordance with claim 13 wherein said metal layer is sputtered and electroplated on said polyimide film surface.

16. An article in accordance with claim 13 having a peel strength of at least 8 pli (14 N/cm) as determined using the IPC Peel Strength, Flexible Printed Wiring Materials method 2.4.9, Revision C, Method B, utilizing an acrylic adhesive.

17. An article in accordance with claim 15 having a peel strength of at least 12 pli (21 N/cm) as determined by using the IPC TM-650 Method A.

* * * * *